United States Patent [19]

Barrett, Jr.

[11] Patent Number: 5,564,089
[45] Date of Patent: Oct. 8, 1996

[54] CURRENT CONTROLLED VARIABLE FREQUENCY OSCILLATOR HAVING AN IMPROVED OPERATIONAL TRANSCONDUCTANCE AMPLIFIER

[75] Inventor: Raymond L. Barrett, Jr., Ft. Lauderdale, Fla.

[73] Assignee: Motorola, Inc., Schaumburg, Ill.

[21] Appl. No.: 49,938

[22] Filed: Apr. 20, 1993

[51] Int. Cl.$^6$ .............................. H04B 1/26; H03F 3/45; H03B 5/20
[52] U.S. Cl. ............... 455/196.1; 455/258; 330/257; 330/260; 331/135; 331/177 R
[58] Field of Search ............... 455/196.1, 195.1, 455/260, 264, 258, 38.3; 340/825.44; 331/135, 177 R, 34; 330/253, 255, 257, 252, 260; 327/560, 562, 538, 540, 541, 542, 543

[56] References Cited

U.S. PATENT DOCUMENTS

| | | | |
|---|---|---|---|
| 4,524,334 | 6/1985 | Brajder et al. | 331/135 |
| 4,667,166 | 5/1987 | Itoh | 330/260 |
| 4,675,594 | 6/1987 | Reinke | 327/542 |
| 4,891,609 | 1/1990 | Eilley | 331/135 |
| 4,965,529 | 11/1990 | Laug | 330/257 |
| 5,117,205 | 5/1992 | Nauta | 331/34 |
| 5,155,452 | 10/1992 | Ueda et al. | 331/177 R |
| 5,208,552 | 5/1993 | Ryat | 330/257 |

OTHER PUBLICATIONS

Analog VLSI and Neural Systems, Carver Mead "California Institute of Technology" Addison–Wesley Publishing Company (pp. 70–71, 147–158, 186–190).

Primary Examiner—Reinhard J. Eisenzopf
Assistant Examiner—Thanh Le
Attorney, Agent, or Firm—Gregg Rasor

[57] ABSTRACT

A current controlled variable frequency oscillator (260) operates at a characteristic frequency that is determined primarily by a scaled current. A filter cascade (320) receives the scaled current for setting a filter cascade frequency substantially equal to the characteristic frequency. Additionally, the filter cascade (320) receives a triangular signal at a non-inverting input, the filter cascade (320) converting the triangular signal into a sinewave signal. A lowpass filter (330) receives the scaled current for setting a lowpass filter frequency to a frequency substantially less than the characteristic frequency. The lowpass filter (330) also receives the sinewave signal and provides an average signal therefrom. A comparator (340) receives the scaled current, wherein the comparator (340) compares the sinewave signal and the average signal for providing a substantially squarewave signal therefrom. An integrator (310) is provided for receiving the scaled current, the integrator (310) integrating the substantially squarewave signal for providing the triangular signal therefrom.

19 Claims, 4 Drawing Sheets

CURRENT CONTROLLED VARIABLE FREQUENCY OSCILLATOR HAVING AN IMPROVED OPERATIONAL TRANSCONDUCTANCE AMPLIFIER

FIELD OF THE INVENTION

This invention relates generally to oscillators, and more particularly to a current controlled variable frequency oscillator having an improved operational transconductance amplifier.

BACKGROUND OF THE INVENTION

Selective call receivers (also known as pagers) have been available for several years and the technology used therein is well known. In its basic form, a selective call receiver is a miniature radio receiver that can be carried on a user's person for receiving radio transmitted messages. Each selective call receiver has a unique address, and when that unique address is received, the selective call receiver alerts the user of a following received message. Selective call receivers, then, allow the user carrying the selective call receiver to receive a page providing that user with a message or notice while the user is away from an office or phone. The page may be a simple beep for alerting the user to call a predetermined telephone number for a message. Alternatively, the page may be more complex, for example, a telephone number or an alphanumeric message displayed on the selective call receiver's message display, or stock quotes or news information received from a news and information service for down-loading into a personal computer from the selective call receiver, etc. Selective call receivers also typically include a variety of accessories. For example, an acknowledge circuit might be included on the selective call receiver for sending a signal back to a transmitter to verify that a page has been received. Additionally, selective call receivers may use a speaker, a flashing LED (light emitting diode), and/or a tactile alert such as a vibrator to alert the user of a received page. Additional features can include backlit displays, improved antennas, low battery alert, etc.

Competition in the selective call receiver market demands not only that additional features be provided, but further that the selective call receivers maintain small form factors, while providing improved quality. Selective call receivers, for example, are now offered in small form factors that can unobtrusively be carried on a belt, on a wrist as a wristwatch pager, or in a pocket in a thin form factor roughly the size of a credit card (credit card or thin form factor). An important factor contributing to the reliability and, hence the quality, of a selective call receiver, is the accuracy of the internal clock, for example, in the controller. Crystals are available for providing accurate oscillator frequencies or clocks and have been used extensively in the past. Crystals continue to be used for providing a reference frequency to clock circuits, but the accuracy of the clock circuits themselves continue to be critical.

A variety of phase shift oscillators, phase locked loops, and other filter and comparator combinations have been made available for integration onto integrated circuits, for example, on a controller, for providing a controlled frequency or clock. Not only do such circuits need to be integratable on such a controller, but a variety of other demands are placed on such circuits, including high stability, precision, and a necessary wide operating range. Such demands are exacerbated by environmental, processing, and other factors.

Thus, what is needed is a variable frequency oscillator having an improved operational transconductance amplifier for providing an integratable, highly stable and accurate clock.

SUMMARY OF THE INVENTION

According to a first aspect of this invention, a current controlled variable frequency oscillator operates at a characteristic frequency that is determined primarily by a scaled current. A filter cascade receives the scaled current for setting a filter cascade frequency substantially equal to the characteristic frequency. Additionally, the filter cascade receives a triangular signal at a non-inverting input, the filter cascade converting the triangular signal into a sinewave signal. A lowpass filter receives the scaled current for setting a lowpass filter frequency to a frequency substantially less than the characteristic frequency. The lowpass filter also receives the sinewave signal and provides an average signal therefrom. A comparator receives the scaled current, wherein the comparator compares the sinewave signal and the average signal for providing a substantially squarewave signal therefrom. An integrator is provided for receiving the scaled current, the integrator integrating the substantially squarewave signal for providing the triangular signal therefrom.

According to a second aspect of this invention, a operational transconductance amplifier is coupled to first and second supply voltages for converting an input voltage into a proportional output current. The operational transconductance amplifier has a common mode input ranging substantially from a magnitude of the first supply voltage to a magnitude of the second supply voltage, wherein the operational transconductance amplifier comprises a first differential amplifier input stage having a non-inverting input coupled to the input voltage, and a second differential amplifier input stage complementary to the first differential amplifier input stage, the second differential amplifier input stage having a non-inverting input coupled to the input voltage, and having an inverting input coupled to an inverting input of the first differential amplifier stage. A current mirror has first and second current paths, the first current path develops a reference voltage, the reference voltage being coupled to the inverting inputs of the first and second differential amplifier stages, and the second current path develops an output current proportional to the reference voltage.

DESCRIPTION OF A PREFERRED EMBODIMENT

Figure 1:
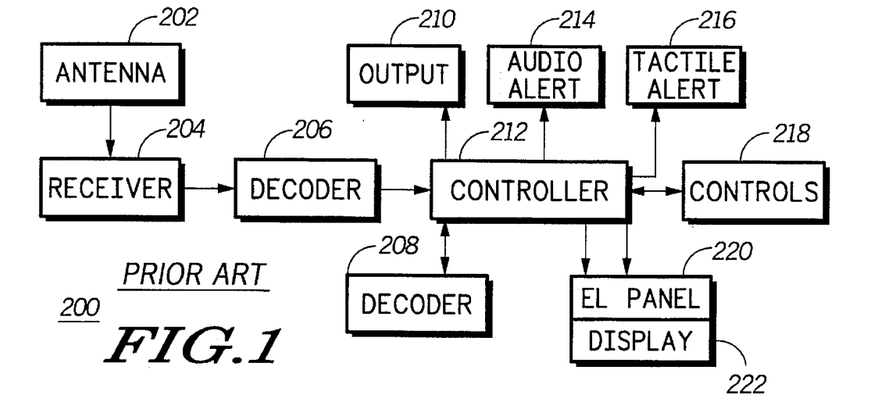
FIG. 1 is a schematic diagram of a prior art selective call receiver circuit.

FIG. 1 illustrates a selective call receiver 200 (i.e., a pager) comprising an antenna 202 for providing an RF carrier signal that is mixed with a local oscillator signal contained within a receiver module 204. The receiver module 204 generates a recovered signal suitable for processing by a decoder 206 in a manner well known to those skilled in the art. The decoder 206 then converts the recovered signal into an address. A controller 212 compares the decoded address with one or more predetermined addresses stored in a memory 208. If the decoded address and one of the predetermined addresses are substantially similar, the user is alerted that a signal has been received either by an audio alert 214 (for example, a speaker) or by a tactile alert 216 (for example, a vibrator). The received signal may also include optional message data directed to some selective call receivers. Also, if the selective call receiver 200 includes an optional voice output, recovered audio portions of the received R.F. signal may be presented on an output module 210. The operation of a selective call receiver of the general type is well known and is more fully described in U.S. Pat. No. 4,518,961 issued May 21, 1985 and assigned to the same assignee as the present invention and is hereby incorporated by reference.

For the message display selective call receiver 200, the recovered message is stored in the memory 208 for subsequent presentation on a display. The display could be an integral part of the selective call receiver 200, such as an EL panel 220, in which case the message display is typically limited to 80 characters. The EL panel 220 is coupled to the controller 212 via lines EL1 and EL2. A display 222, shown as an integral part of the EL panel 220, will automatically, or when manually selected by controls 218, illuminate the message. A display 222 is not necessary to the present invention, for example, an audio display would suffice in beep only alerts, or in the case that only voice messages are provided. Alternatively, the display need not be an integral portion of the selective call receiver 200 if the selective call receiver 200 is coupled to a personal computer, for example, a laptop computer (not shown), in which case a substantially larger message area is available for displaying the message.

Operations of the selective call receiver 200 center around the controller 212, and timing signals provided therefrom are critical to proper operation of the selective call receiver 200. Due to size considerations, it is desirable to integrate timing generating circuits on the controller 212 itself. The timing generating circuits should be made to operate reliably and accurately over a given range of manufacturing tolerances, temperature variations, and supply voltage changes. Additionally, the timing generating circuits should warm-up rapidly so at to provide proper timing quickly after the controller 212 receives power.

Figure 2:
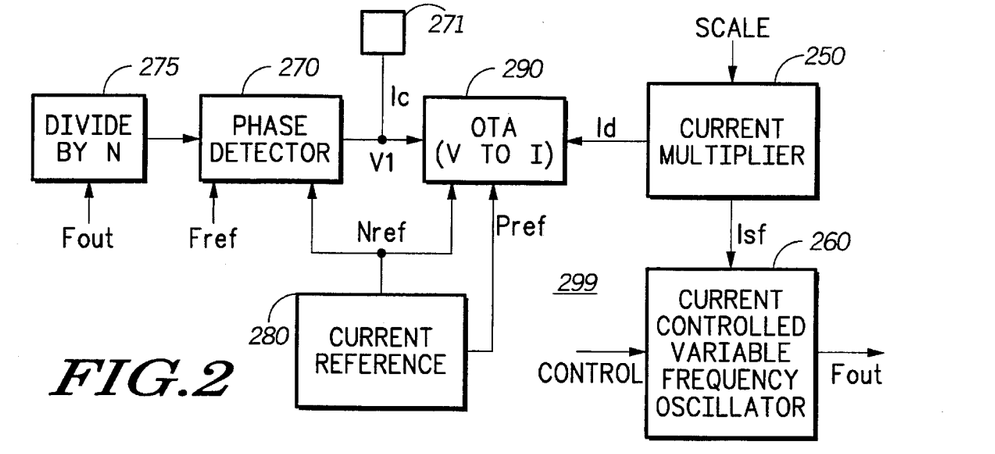
FIG. 2 is a block diagram of a clock circuit comprising an operational transconductance amplifier and a current controlled variable frequency oscillator.

FIG. 2 depicts a clock circuit 299 capable of providing the characteristics described. The clock circuit 299 comprises a current reference circuit 280 that provides bias voltages to a phase detector 270 and to a voltage-to-current converter (V to I) comprising an improved Operational Transconductance Amplifier (hereinafter OTA 290). The bias voltages include an Nref voltage and a Pref voltage for biasing N-channel and P-channel transistors, respectively, contained within the phase detector 270 and the OTA 290. The current reference circuit 280 effectively sets a reference current, and determines the gain, for the phase detector 270 and the OTA 290. The phase detector 270 is capable of sinking, sourcing or floating a current and operates at a given duty cycle, as determined primarily by a charging element 271, for example a capacitor, RC network, or other applicable loop filter, wherein the duty cycle in the phase detector 270 is converted to a charging current Ic. The charging current Ic is converted into an accurate voltage, V1, which is connected to an input of the OTA 290. The operation of the phase detector 270 is well known to those skilled in the art.

The operation and design of OTA's are likewise well known to those skilled in the art. In order to achieve the desired clock circuit 299 accuracy and insensitivities, however, the OTA 290 is designed to exhibit a wide input common mode range while providing a precise voltage-to-current conversion. Hence, V1 is accurately converted to an output current, wherein V1 may vary over a wide range. For example, V1 may swing between power supply rails without a substantial loss in conversion accuracy. When V1 is in a steady state, the output current, Id, becomes a reference current for a current multiplier 250. The current multiplier 250 provides a scaled current, Isf, wherein a magnitude of Isf is determined by a SCALE input signal and the current Id magnitude.

An oscillation frequency, $F_{out}$, of a current controlled variable frequency oscillator 260 is determined primarily by Isf. $F_{out}$ is the clock frequency of interest, for example, for clocking the selective call receiver 200 (FIG. 1). The current controlled variable frequency oscillator 260 varies the frequency of $F_{out}$ linearly according to the magnitude of Isf over a range of frequencies covering at least two decades. Additionally, the current controlled variable frequency oscillator 260 can be made to be substantially insensitive to integrated circuit manufacturing and processing tolerances, and temperature and power supply variations. A divide by N circuit 275 receives Fout at an input and provides a divided frequency to an input of the phase detector 270. Additionally, the phase detector receives a reference frequency, Fref, at a second input.

Assuming that Fout is set equal to 2 megahertz, and an N of 2 is used in the divide by N circuit 275 (and SCALE would be set equal to N or 2), then Fref would be set to 1 megahertz and the phase detector will detect a phase difference between Fref and the output of the divide by N circuit 270. The output, V1, of the phase detector 270 will be a function of the detected phase difference. The current Isf is directly related to Fout such that as Fout increases, Isf increases. An important aspect of the clock circuit 299 is that Four and Isf may change by orders of magnitude while the phase detector 270 and the OTA 290 operate around a center point (i.e., a constant state variable such as V1). The programming of the current multiplier (i.e., the SCALE) should be accomplished when a counter within the divide by N circuit 275 is at zero in order to avoid a phase error due to a switch in the value of N.

Figure 3:
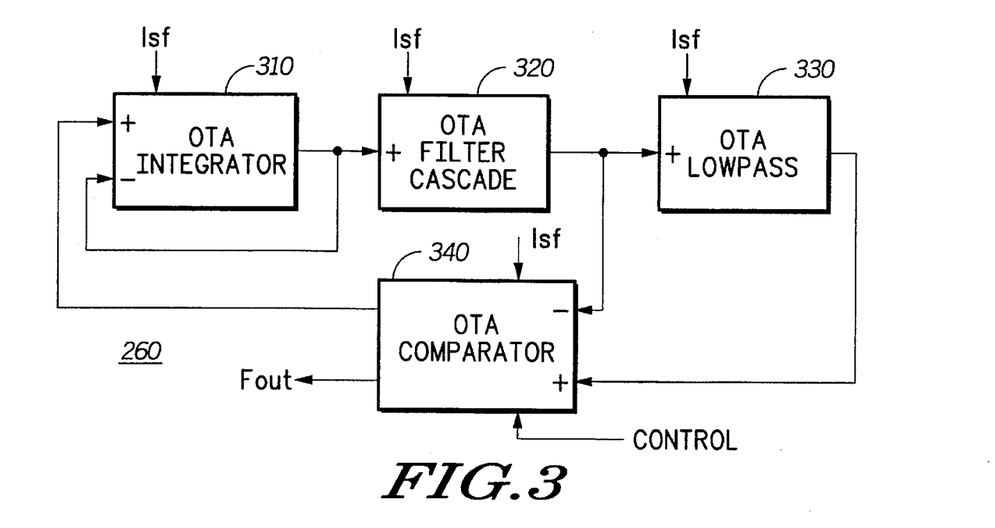
FIG. 3 is a block diagram of the current controlled variable frequency oscillator.

FIG. 3 depicts the current controlled variable frequency oscillator 260 in block diagram form. An OTA integrator 310 has its output signal fedback into its inverting input, and has an output of an OTA comparator 340 connected to a non-inverting input. The output of the OTA comparator 340 is limited to having one of two output voltage magnitudes. The OTA integrator 310, as connected, operates as a first order lowpass filter. However, an effective input voltage created by a difference between the non-inverting and inverting inputs, has a magnitude which saturates a differential input stage therein (see FIG. 4). Consequently, the OTA integrator 310 operates as in integrator circuit due to a resulting limited large signal slew rate. The OTA integrator 310 phase shifts each harmonic component of any periodic rectangular wave input signal by 90 degrees. This 90 degree phase shift is insensitive to variations in the magnitude of the effective input as long as the OTA integrator 310 is slew rate limited. The output of the OTA integrator 310, then, is a piecewise linear signal consisting of segments that are either slew rate limited increases or decreases in magnitude.

An OTA filter cascade 320 has a non-inverting input connected to the output of the OTA integrator 310. Two first order lowpass filters are cascaded providing a desired frequency dependent phase shift as well as a frequency selective magnitude characteristic, thus forming the OTA filter cascade 320 (see FIG. 4). When the output of the OTA integrator 310 is at a characteristic frequency of the OTA filter cascade 320, each first order lowpass filter provides a 45 degree phase shift for a total 90 degree phase shift therethrough. Furthermore, a phase slope at the characteristic frequency is 45 degrees per decade of frequency per each lowpass filter stage, for a total of 90 degrees per decade of frequency for the OTA filter cascade 320. When the frequency of the output signal of the OTA integrator 310 is at a frequency above the characteristic frequency of the OTA filter cascade 320, a magnitude thereof is decreased due to filter attenuation and the phase shift increases, and at frequencies below the characteristic frequency, phase shift is reduced and the magnitude is unattenuated due to the lowpass characteristic. The magnitude of the output of the OTA integrator 310 must remain small enough to prevent slew rate limiting in the OTA filter cascade 320 for correct filtering.

An OTA lowpass filter 330 receives, at a non-inverting input, an output signal (an instantaneous voltage) from the OTA filter cascade 320. A characteristic frequency of the OTA lowpass filter 330 is substantially lower than the characteristic frequency of the OTA filter cascade 320. As a result, an output signal of the OTA lowpass filter 330 estimates an average DC magnitude of the instantaneous voltage of the OTA filter cascade 320.

An OTA comparator 340 receives the instantaneous voltage signal of the OTA filter cascade 320 at an inverting input and the average DC signal of the OTA lowpass filter 330 at a non-inverting input for comparing a magnitude of the instantaneous output to the magnitude of the average DC signal. A resulting signal, Fout, is shaped (square wave) with a resulting phase inversion at a sine wave fundamental component. The output of the OTA comparator 340 is fedback to the non-inverting input of the OTA integrator 310. Hence, a loop phase of the current controlled variable frequency oscillator 260 is a sum of the OTA integrator 260 90 degree phase shift, the OTA filter cascade 320 and the OTA lowpass filter 330 frequency dependent phase shift (90 degrees at the characteristic frequency), and the OTA comparator 340 180 degree phase inversion. At the characteristic frequency, then, the loop phase is 360 degrees and oscillation is possible. Ensuring oscillation, however, requires that a loop gain exceed unity. To accomplish the needed loop gain, an open loop gain of the OTA comparator 340 is designed to exceed a sum of attenuations introduced in the OTA integrator 310, the OTA filter cascade 320, and the OTA lowpass filter 330. The OTA integrator 310 attenuation is designed so that the OTA filter cascade 320 operates in a small signal realm, while the OTA filter cascade 320 and the OTA lowpass filter 330 provide −3 db attenuation each at the characteristic frequency for a total of −6 db attenuation.

In general, the current controlled variable frequency oscillator 260 is designed such that an amplitude of a desired signal is chosen so that the OTA filter cascade 320 and the OTA lowpass filter 330 maintain small signal operation. An output therefrom is determined and the OTA comparator gain 340 is designed sufficient to convert a nearly sinewave output of the OTA lowpass filter 330 to a squarewave within the OTA comparator 340 limits. A time constant of the OTA integrator 310 is chosen for converting the square wave output of the OTA comparator 340 into the necessary input for the OTA filter cascade 320.

Figure 4:
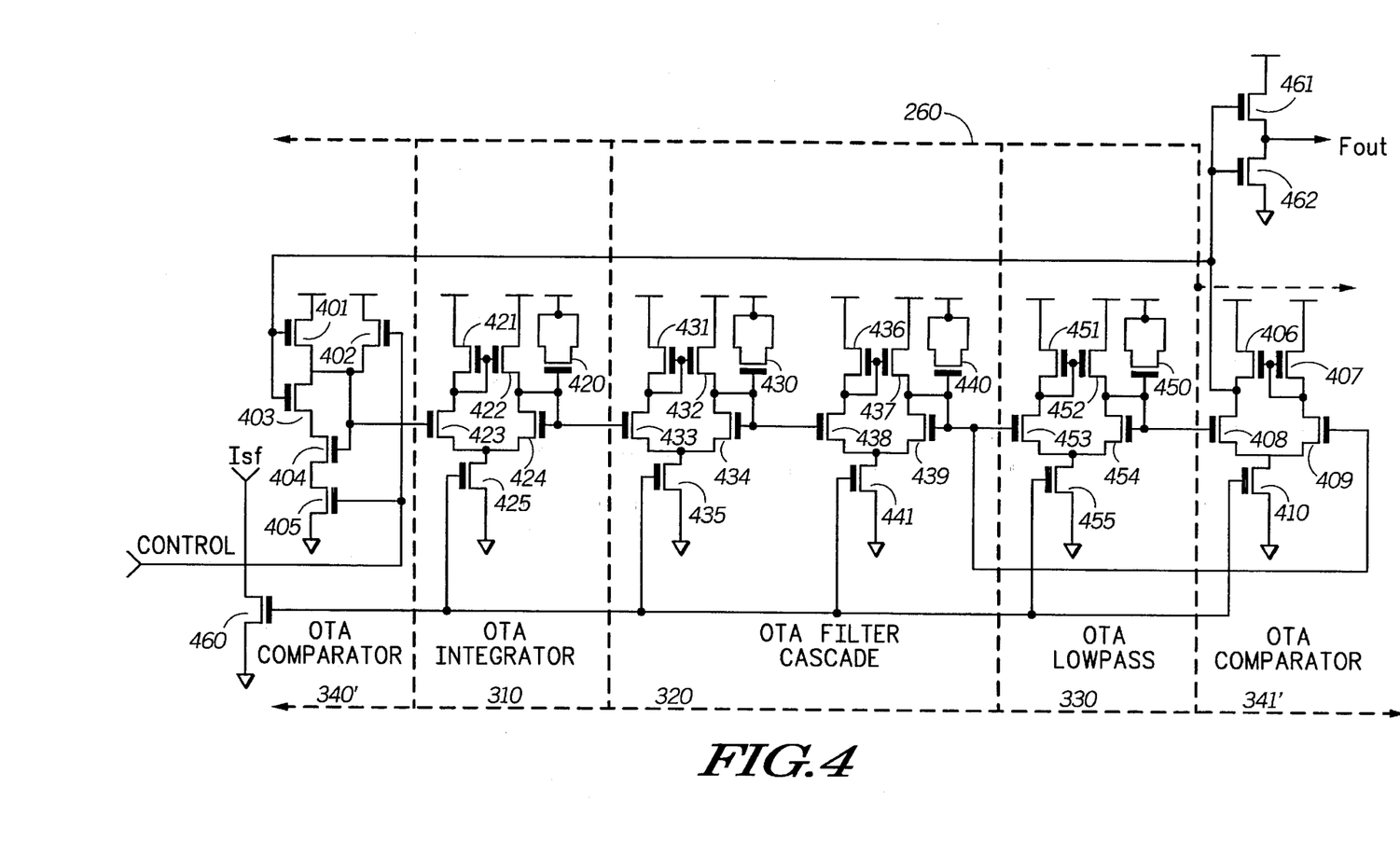
FIG. 4 is a schematic diagram of the current controlled variable frequency oscillator.

FIG. 4 depicts the current controlled variable frequency oscillator 260 in schematic form. The OTA filter cascade 320 comprises transistors 430 through 435 connected as a first OTA that is cascaded to transistors 436 through 441 which are connected as a second OTA. The OTA lowpass filter 330 comprises transistors 450 through 455, wherein the output of the OTA cascade filter 320 (a drain of the transistor 437) is connected to the non-inverting input of the OTA lowpass filter 330 at a gate of the transistor 453. The scaled current, Isf, as provided by the current multiplier 250 is provided to each stage of the current controlled variable frequency oscillator 260 via a diode connected transistor 460. In the OTA filter cascade 20, Isf biases transistors 435 and 441 for providing frequency control therein. The characteristic frequency of the OTA filter cascade 320 is proportional to a ratio of a transconductance of each OTA to a load capacitance of that stage. For example, transistors 430 and 440 provide the load capacitances for the first and second OTA's, respectively. Each transistor 430 and 440 is a P-channel metal oxide semiconductor (PMOS) connected transistor, wherein gate-to-source in parallel with gate-to-drain capacitances (cgs and cgd) provide the respective load capacitance. The use of PMOS transistors 430 and 440 as load capacitances reduces the OTA filter cascade 320's sensitivity to manufacturing tolerances and environmental effects since the same such variations that tend towards increasing the transconductance also tend towards increasing gate capacitance, and hence the transconductance/capacitance ratio tends towards a constant. The frequency of operation is similarly determined by the transconductance/capacitance ratio, and a linear dependence of transconductance on Isf being exploited as a linear current control of frequency.

The OTA lowpass filter 330 operates to determine the average of the sinewave output of the OTA filter cascade 320 for ensuring that the output, Fout, of the OTA comparator 340 will be substantially a squarewave with even order harmonics reduced (particularly the second harmonic), for further aiding in a harmonic attenuation of the OTA integrator 340 and OTA filter cascade 320. Isf is likewise used in the OTA lowpass filter 330 as in the OTA filter cascade 320, which additionally ensures the accuracy of the calculated average of the sinewave output. The PMOS transistor 450 is connected for providing a load capacitance to the OTA lowpass filter 330 with the reduced sensitivity benefits as described above.

The OTA comparator 340 includes transistors 401 through 410 for converting the sinewave output into a squarewave signal for the OTA integrator 310 and ensuring sufficient loop gain for startup, yet reducing loop gain as a fedback input grows (constant output with growing input implies reduced gain). The OTA integrator 340 is thus able to maintain a slew rate for limiting operation while the OTA filter cascade remains in small signal operation. A magnitude of Fout grows during startup until the OTA comparator 340 and OTA integrator 310 limiting ensure that the loop gain is unity, and that the frequency of operation is substantially determined by the current reference programming of the OTA filter cascade 320 and the OTA lowpass filter 330.

The OTA integrator 340, made up of transistors 420 through 425 connected as an OTA with the PMOS transistor 420 connected as a load capacitor, is a slew rate limiting integrator providing an integrator time constant dependent upon Isf acting as a bias current. The OTA integrator 340, having the same bias current as the OTA filter cascade 320 and the OTA lowpass filter 330, has an integration time constant that varies to track the characteristic frequency. Amplitude stabilization of the OTA integrator 340 is also accomplished by varying Isf such that the OTA integrator maintains operation over a small amplitude range, thus providing desensitization to non-linear capacitor characteristics. Therefore, a nearly constant conversion output from squarewave input to triangle wave output is provided which further allows for the small signal operation of the the OTA filter cascade 320 and the OTA lowpass filter 330. The ability to provide a constant output magnitude also translates into excellent power supply variation insensitivity. Additionally, the 90 degree phase shift of the OTA integrator 310 can be made nearly constant over a wide range of Isf.

Figure 5:
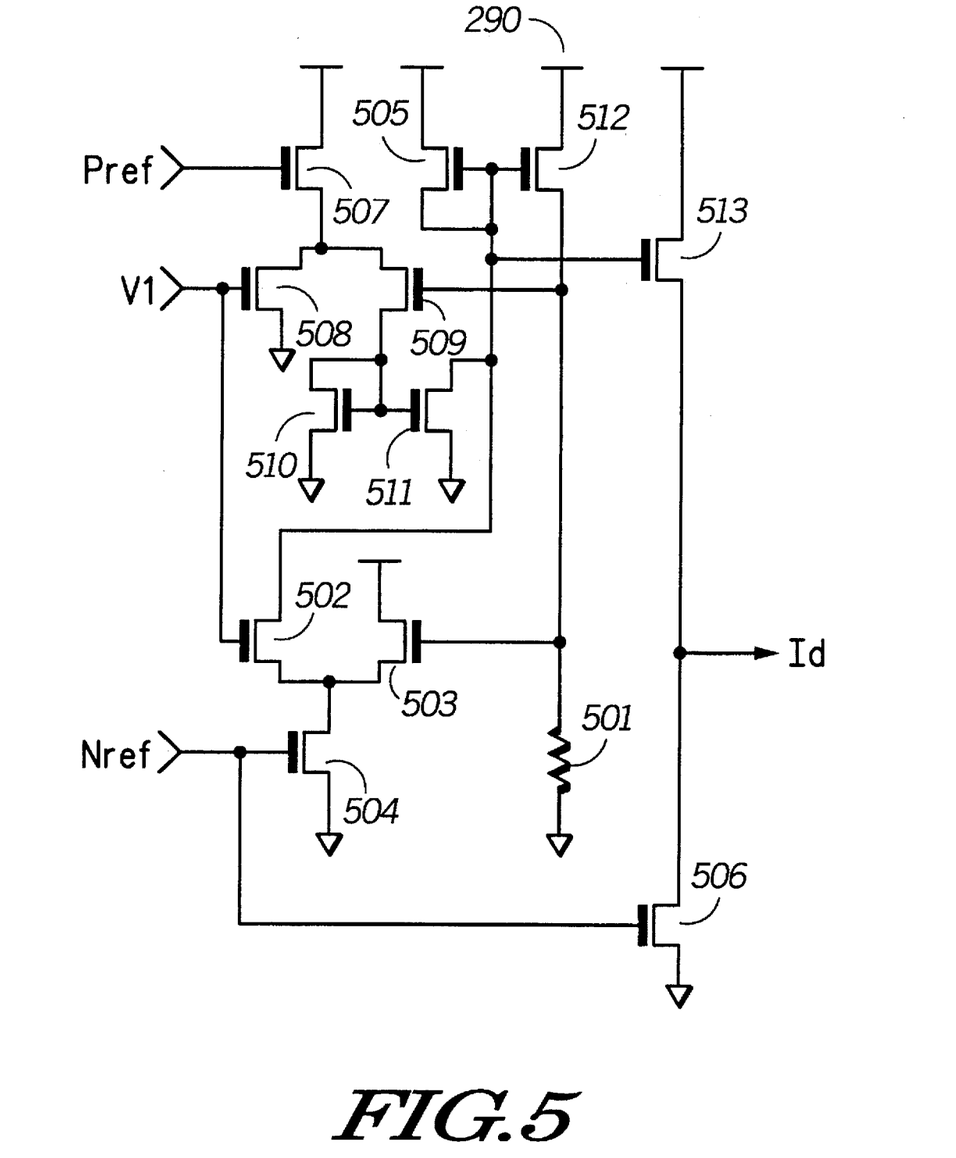
FIG. 5 is schematic diagram of the operational transconductance amplifier as used in the clock circuit of FIG. 2.

Referring now to FIG. 5, a schematic diagram of the OTA 290 (FIG. 2) is shown comprising devices 501 through 513. A PMOS transistor 507 is biased by Pref and NMOS transistors 504 and 506 are biased by Nref, wherein Pref and Nref are provided by the current reference 280 (FIG. 2). V1, input at transistors 502 and 508, is provided from the output of the phase detector 290. The OTA is designed to have a wide input common mode range while providing precision voltage to current conversion. The operation and design of the OTA 290 can be better understood by first examining the alternative designs and operations of OTA 600 and OTA 700.

Figure 6:
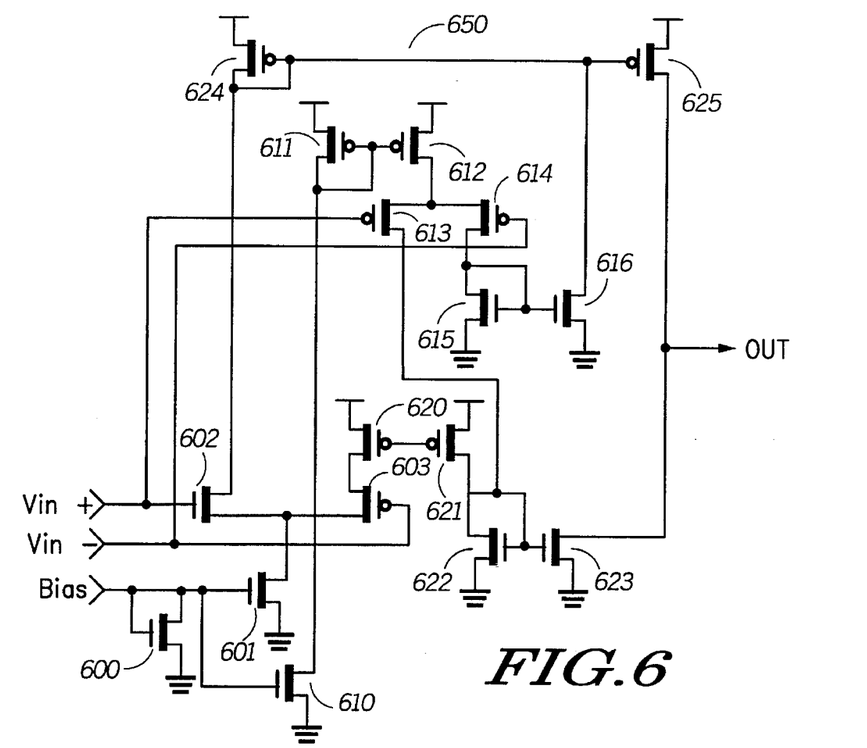
FIG. 6 is a schematic diagram of an alternative embodiment of an operational transconductance amplifier.

FIG. 6 is a schematic diagram of an OTA 650 having a wide input common mode range. Transistors 600 through 603 are connected for forming an input stage of a differential amplifier as is well known in the art. Additionally, transistors 620 through 625 are connected for forming a current mirror and output stage as is also well known in the art. Transistors 610 through 616 are added forming an additional differential amplifier complementary to the differential amplifier formed by transistors 600 through 603. In the case of MOS OTA's, if the existing differential amplifier stage is a PMOS differential amplifier, than the added differential stage would be NMOS, or vice versa.

Given an OTA consisting of only an NMOS differential amplifier and a current mirror (i.e., transistors 600 through 603, and transistors 620 through 625), an input common mode range associated therewith must have a magnitude more positive than a threshold voltage magnitude of the NMOS differential transistors (i.e., transistors 602 and 603). Such an OTA, however, may have a common input mode range that approaches a positive supply voltage as an upper limit. Given a small supply voltage of 1 to 2 volts, for example, and a typical NMOS threshold voltage of 0.6 volts, results in a common mode range of 0.6 to 2.0 volts.

A complementary differential stage suffers similar reduction of common mode input range due to a threshold voltage of the PMOS transistors. A common mode input range for the complementary differential stage, however, is from zero volts to the magnitude of the positive supply voltage minus the PMOS transistor threshold voltage. Using complementary differential amplifiers, as shown in FIG. 6, causes the common mode input range of the complementary differential amplifiers to overlap, thus providing a common mode range from approximately zero volts to the positive supply voltage. If the supply voltage is small, for example, less than a sum of the NMOS and PMOS threshold voltages, then the combined common mode range could be disjoint. Subthreshold operation in the disjoint region is smooth, however, if the disjoint region is small.

Figure 7:
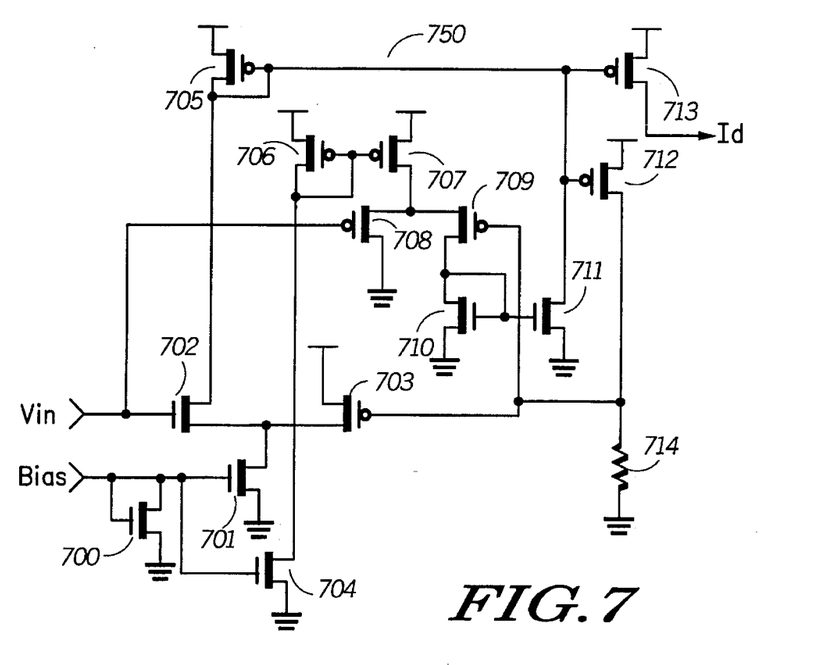
FIG. 7 is a schematic diagram of a second alternative embodiment of an operational transconductance amplifier.

FIG. 7 depicts an OTA 750 in schematic form, the OTA 750 providing precise voltage to current conversion. Transistors 700 through 703 are connected to function as an NMOS differential amplifier input stage while transistors 707 through 709 are connected to function as a PMOS differential amplifier input stage which is complementary to, and in parallel with the NMOS differential amplifier stage. The combination of the NMOS differential amplifier input stage and the parallel connected PMOS differential amplifier input stage operate to extend a common mode input range of the OTA 750 similarly as described for the OTA 650. Transistors 704 and 706 form a current mirror for providing a bias current to the PMOS differential amplifier stage, the bias current being proportional to a bias current in the NMOS differential amplifier stage.

Transistors 710 and 711 are connected to form a current mirror for redirecting an output current of the PMOS differential amplifier stage for summing with an output current of the NMOS differential amplifier stage, the summed currents flowing into diode connected transistor 705. The transistor 705 provides a reference for two current mirrors, the current mirrors formed by transistors 712 and 713, respectively. The current mirror formed by transistors 705 and 712 conducts a first current through a resistor 714 for developing a corresponding proportional voltage across the resistor 714. The mirror formed by transistors 705 and 713 conducts a current, Id, proportional to transistor dimension ratios of the transistors 712 and 713.

Inverting inputs of both the NMOS and PMOS differential amplifier stages are connected in parallel to the resistor 714 thus closing a feedback loop around the NMOS and PMOS differential amplifier stages for ensuring a sufficient loop gain and that the voltage drop developed across the resistor 714 is an accurate conversion of an input voltage, Vin. The output current, Id, is also proportional to Vin since the current flowing in the transistor 713 is proportional to the current flowing in the transistor 712. Hence, the resistor 714, which provides improved linearity and environmental stability, substantially determines the voltage to current conversion accuracy. Additionally, Id may be scaled substantially up or down as a function of the geometries of the transistors 712 and 713. Current mirrors are formed by transistor pairs 505 and 512, and 505 and 513. A proportional voltage to the input voltage V1 is developed across a resistor 501, wherein the proportional voltage is further applied to inverting inputs of the NMOS and PMOS differential amplifier stages. Id, the output current, is provided through the transistor 713, and Id is proportional to a current flowing through the resistor 501.

Referring back to FIG. 5, it can more easily be understood that the OTA 290 provides both wide common mode input range and an accurate voltage to current conversion. An NMOS differential amplifier stage is formed by transistors 501 through 503 and a PMOS differential amplifier stage is formed by transistors 507 through 509.

It may be appreciated by now that there has been provided an improved current controlled frequency oscillator whose frequency varies linearly with a programming current, the useful range of frequency spanning at least two decades. Insensitivity to manufacturing tolerances, temperature and power supply variations is also provided. Additionally, the current controlled variable frequency oscillator may be integrated into a controller or other chip without the need for external components, except for a crystal for providing a reference frequency thereto.

Although the present invention has been described in relation to particular embodiments thereof, many other variations and modifications and other uses will become apparent to those skilled in the art. For example, other types of devices besides a selective call receiver may benefit from the improved oscillator, such as the receiver section. Additionally, the invention need not be limited to selective call receivers, but extends to other electrical circuits and systems requiring an accurate clock or other frequency. Therefore, the present invention is limited only by the claims.

I claim:

1. A current controlled variable frequency oscillator having a characteristic frequency determined primarily by a scaled current, the current controlled variable frequency oscillator comprising:

a filter cascade responsive to the scaled current for setting a filter cascade frequency substantially equal to the characteristic frequency, the filter cascade receiving a triangular signal at an filter cascade input, the filter cascade convening the triangular signal into a sinewave signal;

a lowpass filter responsive to the scaled current which sets a lowpass filter cutoff frequency to a frequency substantially less than the characteristic frequency of the variable frequency oscillator such that the lowpass filter which is coupled to the filter cascade and receives the sinewave signal at a lowpass filter input, operates to provide an average of the sinewave signal;

a comparator having a comparator input that receives the scaled current, the comparator being coupled to an output of the filter cascade and an output of the lowpass filter for comparing the sinewave signal and the average of the sinewave signal and generating a squarewave signal from the comparison; and an integrator coupled to the comparator and responsive to the scaled current, the integrator integrating the squarewave signal to generate the triangular signal therefrom, the triangular signal then being coupled to the filter cascade to provide a closed loop control for the current controlled variable frequency oscillator.

2. The current controlled variable frequency oscillator according to claim 1 wherein a gain of the comparator is greater than a sum of attenuations of the filter cascade, the lowpass filter, and the integrator.

3. The current controlled variable frequency oscillator according to claim 1 wherein the cascade filter provides substantially 45 degrees phase shift at the characteristic frequency.

4. The current controlled variable frequency oscillator according to claim 3 wherein the cascade filter further comprises:

a first operational transconductance amplifier receiving the triangular signal at a non-inverting input;

a first capacitive load coupled between an output of the first operational transconductance amplifier and an inverting input of the first operational transconductance amplifier;

a second operational transconductance amplifier cascaded to the first operational transconductance amplifier; and a second capacitive load coupled between an output of the second operational transconductance amplifier and an inverting input of the second operational transconductance amplifier.

5. The current controlled variable frequency oscillator according to claim 4 wherein the first and second capacitive loads are substantially derived from MOS transistor gate capacitances.

6. The current controlled variable frequency oscillator according to claim 5 wherein the triangular output signal applied to the cascade filter allows the cascade filter to operate in a small signal realm.

7. The current controlled variable frequency oscillator according to claim 6 wherein the first and second operational transconductance amplifiers each provide a phase slope of substantially 45 per decade of frequency.

8. A selective call receiver having an accurate clock circuit integrated on a controller chip, the selective call receiver comprising:

an antenna for receiving a radio transmitted signal;

a receiver coupled to the antenna for generating a recovered signal from the received signal;

a decoder coupled to the receiver for converting the recovered signal into an address;

a memory for storing a predetermined address; and a controller coupled to the memory and the decoder, the controller determining whether the address matches the predetermined address for alerting a user that a call has been received, the controller further having the integrated clock circuit therein for providing a clock signal to the selective call receiver, the clock circuit comprising:

a current reference circuit for providing an accurate bias voltage;

a phase detector receiving the accurate bias voltage, and providing a charging current based upon a reference frequency and a divided clock signal, the phase detector converting the charging current into a reference voltage;

an operational transconductance amplifier receiving the reference voltage and converting the reference voltage into a reference current;

a current multiplier coupled to the operational transconductance amplifier wherein the reference current sets a bias in the current multiplier, the current multiplier further receiving a scale signal for determining a magnitude of a scale current; and a current controlled variable frequency oscillator having a characteristic frequency dependent upon the magnitude of the scale current, the current controlled variable frequency oscillator comprising:

a filter cascade responsive to the scaled current for setting a filter cascade frequency substantially equal to the characteristic frequency, the filter cascade receiving a triangular signal at an filter cascade input, the filter cascade converting the triangular signal into a sinewave signal;

a lowpass filter responsive to the scaled current which sets a lowpass filter cutoff frequency to a frequency substantially less than the characteristic frequency of the variable frequency oscillator such that the lowpass filter which is coupled to the filter cascade and receives the sinewave signal at a lowpass filter input, operates to provide an average of the sinewave signal;

a comparator having a comparator input that receives the scaled current, the comparator being coupled to an output of the filter cascade and an output of the lowpass filter for comparing the sinewave signal and the average of the sinewave signal and generating a squarewave signal from the comparison; and an integrator coupled to the comparator and responsive to the scaled current, the integrator integrating the squarewave signal to generate the triangular signal therefrom, the triangular signal then being coupled to the filter cascade to provide a closed loop control for the current controlled variable frequency oscillator.

9. The selective call receiver according to claim 8 wherein the operational transconductance amplifier has a common mode input range that substantially varies from a from a first supply voltage to a second supply voltage.

10. The selective call receiver according to claim 8 wherein a gain of the comparator is greater than a sum of attenuations of the filter cascade, the lowpass filter, and the integrator.

11. The selective call receiver according to claim 8 wherein the cascade filter provides substantially 45 degrees phase shift at the characteristic frequency.

12. The selective call receiver according to claim 11 wherein the cascade filter further comprises:

a first operational transconductance amplifier receiving the triangular signal at a non-inverting input;

a first capacitive load coupled between an output of the first operational transconductance amplifier and an inverting input of the first operational transconductance amplifier;

a second operational transconductance amplifier cascaded to the first operational transconductance amplifier; and a second capacitive load coupled between an output of the second operational transconductance amplifier and an inverting input of the second operational transconductance amplifier.

13. The selective call receiver according to claim 12 wherein the first and second capacitive loads are substantially derived from MOS transistor gate capacitances.

14. The selective call receiver according to claim 13 wherein the triangular output signal applied to the cascade filter allows the cascade filter to operate in a small signal realm.

15. The selective call receiver according to claim 14 wherein the first and second operational transconductance amplifiers each provide a phase slope of substantially 45 per decade of frequency.

16. An operational transconductance amplifier coupled to first and second supply voltages for converting an input voltage into a proportional output current and having a common mode input range from a magnitude of the first supply voltage to a magnitude of the second supply voltage, the operational transconductance amplifier comprising:

a first differential amplifier input stage having a non-inverting input coupled to the input voltage, and having an inverting input;

a second differential amplifier input stage complementary to the first differential amplifier input stage, the second differential amplifier input stage having a non-inverting input coupled to the input voltage, and having an inverting input; and a current mirror having first and second current paths, the first path developing a reference voltage, the reference voltage coupled to the inverting inputs of the first and second differential amplifier stages, the second current path developing an output current proportional to the reference voltage, the current mirror comprising:

a first resistor;

a first P-type transistor having a source coupled to a first supply voltage, and a gate and a drain coupled to the first differential amplifier input stage;

a second P-type transistor having a source coupled to the first supply voltage, a gate coupled to the gate of the first P-type transistor, and a drain coupled to the first amplifier input stage and further coupled to a second supply voltage via the first resistor for developing the reference voltage thereacross; and a third P-type transistor having a source coupled to the first supply voltage, a gate coupled to the gate of the first P-type transistor, and a drain coupled to the second supply voltage to which the output current is conducted by the third P-type transistor providing the output current.

17. The operational transconductance amplifier according to claim 16 wherein the first differential amplifier input stage is constructed from N type devices, and the second differential amplifier input stage is constructed from P type devices.

18. The operational transconductance amplifier according to claim 16 wherein the first differential amplifier input stage is constructed from P type devices, and the second differential amplifier input stage is constructed from N type devices.

19. The operational transconductance amplifier according to claim 17 wherein the third P-type transistor is a predetermined ratio of the second P-type transistor for scaling the output current relative to the voltage.

* * * * *